United States Patent [19]

Yoshida

[11] Patent Number: 4,489,374
[45] Date of Patent: Dec. 18, 1984

[54] RECTIFYING APPARATUS FOR AUTOMOTIVE A.C. GENERATOR

[75] Inventor: Yasuhiro Yoshida, Hyogo, Japan

[73] Assignee: Mitsubishi Denki Kabushiki Kaisha, Tokyo, Japan

[21] Appl. No.: 418,176

[22] Filed: Sep. 14, 1982

[30] Foreign Application Priority Data

Sep. 21, 1981 [JP] Japan .................. 56-141282[U]
Sep. 22, 1981 [JP] Japan .................. 56-141214[U]

[51] Int. Cl.³ ............................................. H02M 1/00
[52] U.S. Cl. ........................................ 363/145; 322/28
[58] Field of Search .................. 363/34, 37, 39, 44, 363/45, 123, 125, 126, 144, 145; 310/680; 322/28

[56] References Cited

U.S. PATENT DOCUMENTS 4,232,238 11/1980 Saito et al. .................. 363/145
4,367,523  1/1983 Urba ........................... 363/144

FOREIGN PATENT DOCUMENTS 2150127  4/1972 Fed. Rep. of Germany ...... 363/126

Primary Examiner—William M. Shoop
Assistant Examiner—Anita M. Ault
Attorney, Agent, or Firm—Wenderoth, Lind & Ponack

[57] ABSTRACT

A rectifying apparatus for an automotive A.C. generator which is used for converting an A.C. output of the generator into a direct current, and which includes a plurality of rectifiers, each having a semiconductor chip and a capacitor connected in parallel therewith, thereby forming a parallel connection, and having a protecting sealer for insulating and sealing the parallel connection.

2 Claims, 15 Drawing Figures

RECTIFYING APPARATUS FOR AUTOMOTIVE A.C. GENERATOR

BACKGROUND OF THE INVENTION

This invention relates to an improvement in a rectifying apparatus which rectifies the output of an A.C. generator into a direct current and supplies the direct current for the charge of a storage battery and an electric load device on a vehicle such as an automobile.

A conventional generator apparatus which accommodates an A.C. generator and rectifying devices for a vehicle has been made up, as entirely shown in FIG. 1. In FIG. 1, reference numeral 1 denotes an A.C. generator, and 2 denotes a field winding which is mounted on a rotor of the generator 1. The field winding 2 is energized from a stator section side through a slip ring unit (not shown). The rotor is driven by an automotive engine. Reference numeral 3 denotes an armature winding which is mounted on a stator of the generator 1. The armature winding, as shown, involves 3-phase windings, which induce 3-phase A.C. voltages. Reference numeral 4 denotes a first rectifying device which accommodates three sets of semiconductor rectifiers 7. The output voltage from the armature winding 3 is applied to the anode sides of the respective rectifying devices 4. Reference numeral 5 denotes a second rectifying device which accommodates three sets of semiconductor rectifiers 7. The output voltages from the armature winding 3 is applied to the cathode sides of the respective rectifying devices 5. Thus, both the first and second rectifying devices 4 and 5 full-wave-rectify the A.C. voltage output from the A.C. generator 1. Reference numeral 6 denotes a third rectifying device which accommodates three sets of semiconductor rectifiers 7, which are connected in parallel with the rectifying device 4 with respect to a storage battery 10. The third rectifying device is used as an excitation power source for the A.C. generator 1. These respective rectifiers 7 are installed in a bracket (not shown) of the generator 1. Reference numeral 8 denotes a key switch, and 9 denotes a charge indication lamp which indicates the charging state of the generator 1. The storage battery 10 is charged by the D.C. voltage output which is full-wave rectified by the rectifying devices 5 and 6. Reference numeral 11 denotes a voltage regulator which serves to maintain the output voltage of the generator 1 at a predetermined level, and 12 denotes a load switch which opens or closes a circuit of an electric load 13 from the rectifying devices 4 and 5, and the storage battery 10. Reference numeral 14 denotes a D.C. output terminal of the rectifying device 4, and 15 denotes an initial excitation terminal, 16 denotes a field winding terminal, and 17 denotes a terminal which is connected to an automotive body.

In the conventional generator apparatus described above, the result of the D.C. output from the generator apparatus in the state of spectral analysis in the frequency range of 0 to 2 MHz is shown in FIG. 2. In FIG. 2, it is understood that noise of approx. −60 to −40 dB has been involved in the above D.C. output in the frequency range of 0 to 2 MHz. Such noise which is thus contained in the above-described frequency band is detrimental for a radio transmitter/receiver.

In order to remove such noise components in the D.C. output of the conventional generator apparatus, another example of a generator apparatus has been made up, as shown in FIG. 3. This example has substantially equal arrangements to the circuit arrangement shown in FIG. 1, but a capacitor 18 which accommodates a capacity of 0.5 to 2 $\mu$F is connected between the D.C. output terminal 14 and an automotive body to absorb and reduce the noise which has been produced from the rectifying devices 4 and 5.

FIGS. 4 and 5 show the results of the D.C. output from this example of the conventional generator apparatus in FIG. 3 in the state of spectral analysis in the frequency range of 0 to 2 MHz in terms of capacitors accommodating capacities of 0.5 and 2 $\mu$F, respectively.

From FIG. 4, showing in case of the capacitor 18 having 0.5 $\mu$F, it is understood that most noise has been removed as compared with the result shown in FIG. 2 in case of no capacitor connected. However, this result still shows noise in the range of 100 kHz which has not yet been sufficiently removed and therefore remains.

From FIG. 5, showing in case of the capacitor 18 having 2 $\mu$F, it is understood that the noise remaining in the vicinity of 100 kHz has almost been completely removed, and the noise level has also been reduced to approx. −70 dB, which causes almost no problem in a practical use.

In the conventional generator apparatus described above, a capacitor which accommodates a relatively large capacity is required so as to completely remove the noise which has been produced from the rectifying devices 4 and 5. It is thus necessary to involve a capacitor which has a capacity of as low as 0.5 $\mu$F in the generator apparatus so as to remove the noise to a certain degree, and this accordingly results in a high cost and complicated works in the installation of the capacitor.

SUMMARY OF THE INVENTION

It is an object of the present invention to provide a rectifying apparatus for an automotive A.C. generator in which the above-mentioned drawbacks and disadvantages of the conventional rectifying apparatus can be eliminated and noise produced due to a commutation surge of rectifiers thereof can be obviated by connecting capacitors in parallel with the semiconductor chips of the rectifiers.

It is another object of the present invention to provide a rectifying apparatus for an automotive A.C. generator which can be inexpensively constructed without necessity of the external connections of the capacitors with the same profile of the rectifiers as the conventional rectifiers and preferable assembling workability.

In order to achieve the above and other objects, capacitors are respectively connected in parallel with semiconductor chips of rectifiers in the rectifying apparatus of the present invention, thereby removing the noise produced from the respective rectifiers without altering the configuration of the respective rectifiers nor necessity of the external connection of the capacitors thus connected.

BRIEF DESCRIPTION OF THE DRAWINGS

The same reference numerals in the accompanying drawings denote the same or equivalent parts and components through all the drawings.

DESCRIPTION OF THE PREFERRED EMBODIMENTS

The present invention will now be described in more detail with reference to the accompanying drawings.

Figure 6:
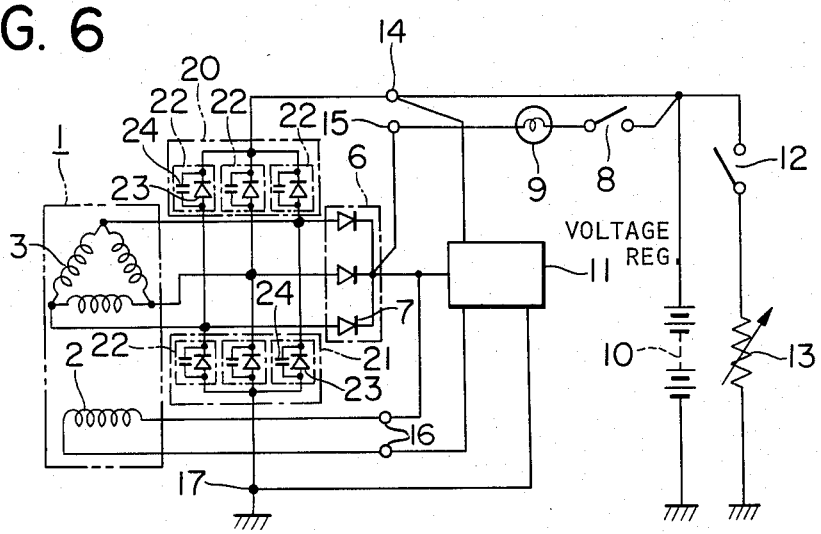
FIG. 6 is a circuit diagram showing an embodiment of an automotive generator apparatus employing the rectifying device of the present invention.

FIG. 6 is a circuit diagram showing a preferred embodiment of an automotive generator apparatus employing the rectifying device according to the present invention, wherein reference numerals 1 to 3 and 6 to 17 denote the same units and components employed in the conventional generator apparatus described above. Reference numeral 20 denotes a first rectifying device which accommodates 3 sets of rectifiers 22. The output voltage from the armature winding 3 is applied to the anode sides of the rectifiers 22. Reference numeral 21 denotes a second rectifying device which accommodates 3 sets of rectifiers 22. The output voltage from the armature winding 3 is applied to the cathode sides of the rectifiers 22. Both the first and second rectifying devices 20 and 21 full-wave-rectify the voltage from the armature winding 3 of the generator 1. The rectifier 22, as will be described in detail with reference to FIGS. 8 to 15, involves a semiconductor chip 23 and a capacitor 24 connected in parallel with the chip 23. The third rectifying device 6 has a low ouput, thereby causing only a low noise level and accordingly, does not employ capacitors but involves only the rectifiers 7.

Figure 1:
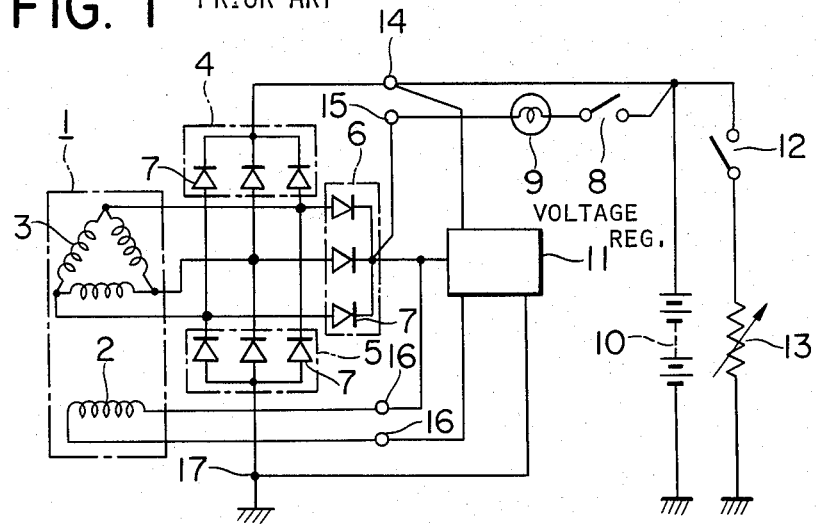
FIG. 1 is a circuit diagram of a conventional generator apparatus which involves an A.C. generator and rectifying devices.
Figure 2:
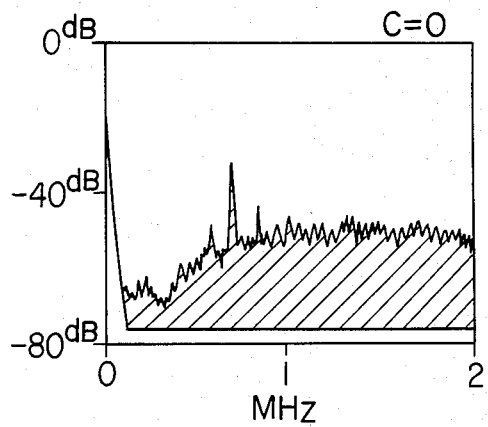
FIG. 2 is a graphical representation of the spectral analysis of the D.C. output of the conventional rectifying apparatus in FIG. 1.
Figure 3:
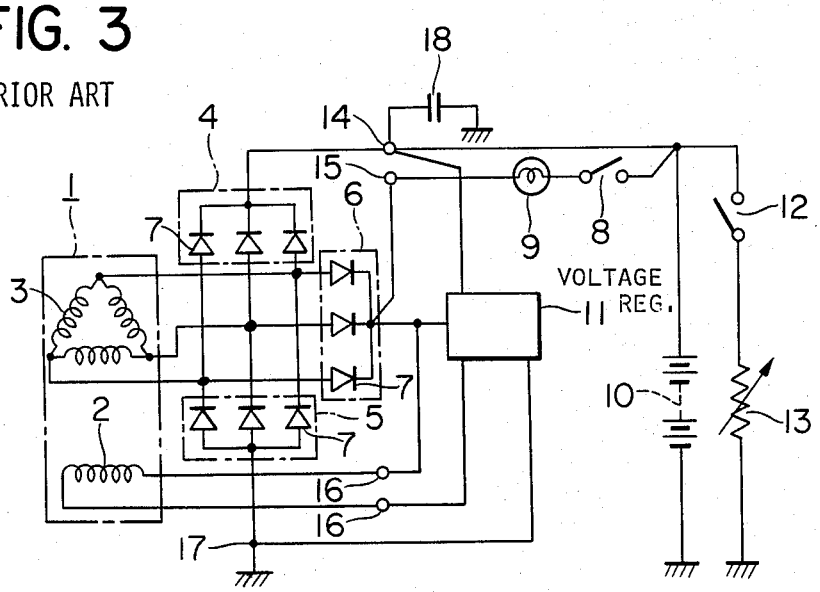
FIG. 3 is a circuit diagram showing a generator apparatus improved in the rectifying devices of the generator apparatus in FIG. 1.
Figure 4:
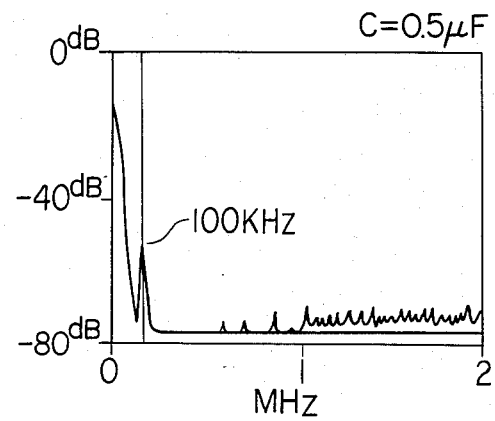
FIGS. 4 and 5 are graphical representations of the spectral analysis of the D.C. outputs of the rectifying apparatuses which respectively employ capacitors of 0.5 $\mu$F and 2 $\mu$F in the apparatus in FIG. 3.
Figure 5:
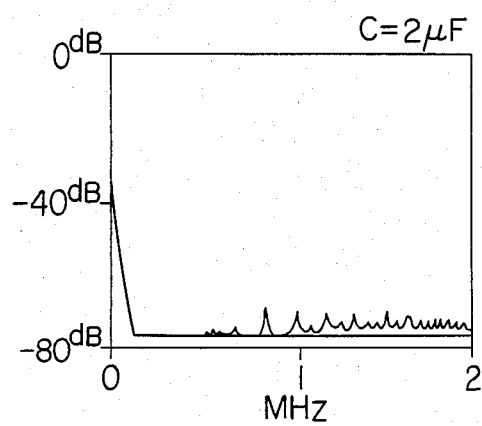
Figure 7:
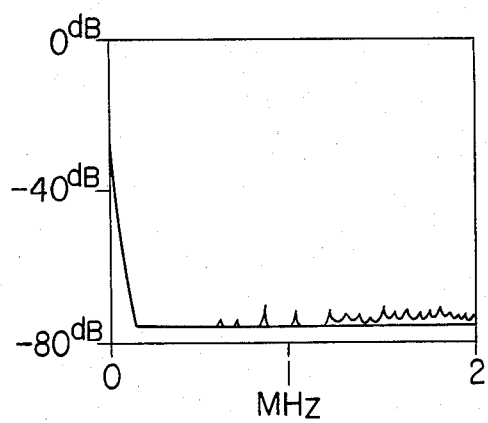
FIG. 7 is a graphical representation of the spectral analysis of the D.C. output of the apparatus in FIG. 6.

FIG. 7 shows the result of the spectrally analyzed D.C. output of the generator apparatus in FIG. 6. As shown in FIG. 7, noise is not substantially produced in the frequency range of 0 to 2 MHz, allowing the noise level to be reduced to the extent equivalent to or more than the generator apparatus which employs the capacitor 18 of 2 $\mu$F in FIG. 3.

Figure 8:
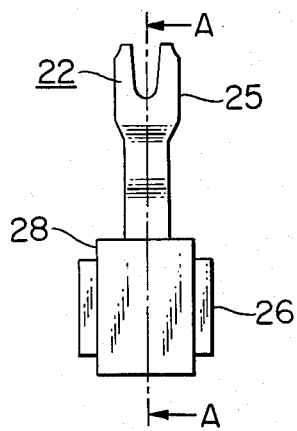
FIG. 8 is a front view showing an embodiment of the rectifying device constructing the rectifying apparatus in FIG. 6.
Figure 9:
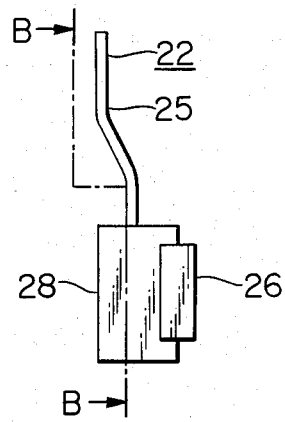
FIG. 9 is a side view of the rectifying device in FIG. 8.
Figure 10:
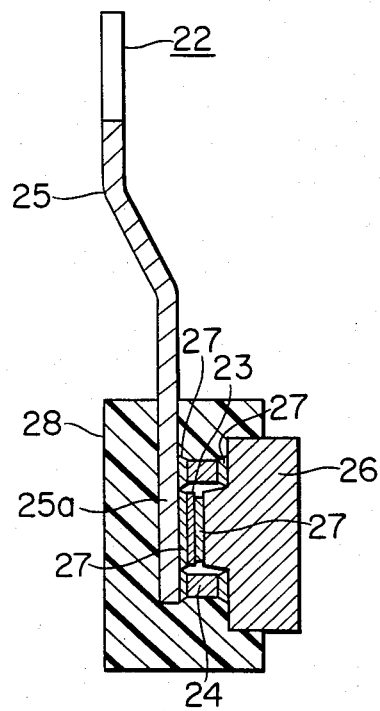
FIG. 10 is an enlarged sectional view of the rectifying device along the line A—A in FIG. 8.
Figure 11:
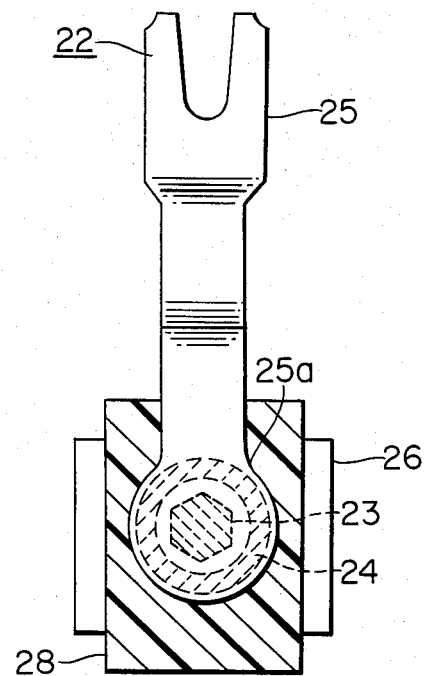
FIG. 11 is an enlarged sectional view of the rectifying device along the line B—B in FIG. 9.
Figure 12:
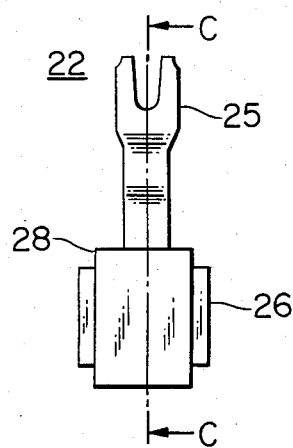
FIG. 12 is a front view showing another embodiment of the rectifying device constructing the rectifying apparatus of the present invention in FIG. 6.
Figure 13:
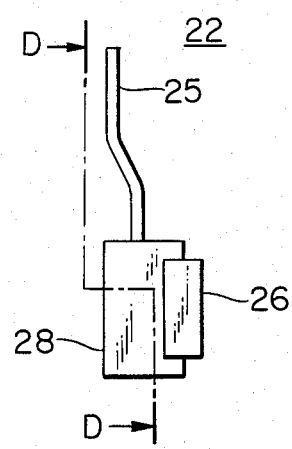
FIG. 13 is a side view of the rectifying device in FIG. 12.

A preferred embodiment of the rectifier 22 thus employed in the generator apparatus of the present invention is shown in FIGS. 8 to 11. FIG. 8 shows a front view, FIG. 9 shows a side view, FIG. 10 is an enlarged sectional view along the line A—A in FIG. 8, FIG. 9 is a side view, and FIG. 11 is an enlarged sectional view along the line B—B in FIG. 9. In this embodiment, the rectifier 22 is constructed as below. Reference numeral 25 denotes an external connection terminal which is made of metal. A semiconductor chip 23 which is formed of a silicon chip, functioning as a rectifier is soldered with a solder material 27 to the center of one end 25a of the terminal 25. Further, a cylindrical capacitor 24 is soldered with a solder material 27 to the vicinity of the outer periphery of the end 25a of the terminal 25. The semiconductor chip 23 and the capacitor 24 are respectively soldered with a solder material 27 to a heat sink 26 which is formed with a projection on the center of the bottom and is preferably made of metal. In this manner, the semiconductor chip 23 and the capacitor 24 are connected in parallel with each other between the heat sink 26 and the external connection terminal 25. Reference numeral 28 denotes a protecting sealer to insulate and seal the parallel connector of the semiconductor chip 23 and the capacitor 24 between the end 25a of the terminal 25 and the heat sink 26. This sealer 28 is formed, for example, of synthetic resin, and is molded with the synthetic resin. With the construction thus formed, the capacitor 24 is contained in the respective rectifiers 22. Thus, the static capacity of the capacitor 24 may be small enough to be approx. 1/10 of the conventional capacitor 18, and hence the outer dimension of the rectifier 2 is not increased.

Figure 14:
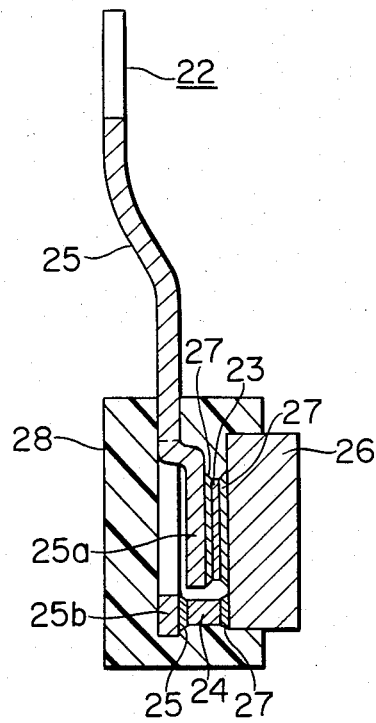
FIG. 14 is an enlarged sectional view of the rectifying device along the line C—C in FIG. 12.
Figure 15:
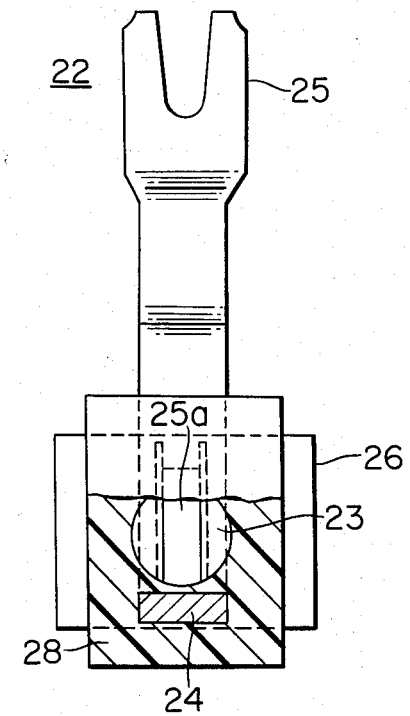
FIG. 15 is an enlarged sectional view of the rectifying device along the line D—D in FIG. 13.

FIGS. 12 to 15 shows another preferred embodiment of the rectifier, wherein the like units and components corresponding to those in the previous embodiment in FIGS. 8 to 11 will be denoted by the same reference numerals as those in FIGS. 8 to 11. In this embodiment, a capacitor 24 is of a rectangular box shape as shown in FIGS. 14 and 15. As shown in FIG. 14, the thickness of a semiconductor chip 23 is thinner than that of the capacitor 24. Accordingly, in this embodiment, a notch is formed at the center of the end 25b of an external connection terminal 25, and is erected to form a bent part 25a. A semiconductor chip 23 is provided at the bent part 25a. The capacitor 24 is not provided at the bent part 25a but is provided at the end 25b. A heat sink 26 which confronts the terminal 25 is formed planarly. The semiconductor chip 23 and the capacitor 24 are respectively soldered to the heat sink 26 to form a parallel connector. This parallel connector is insulated and sealed by a protecting sealer 28 in the same manner as described with respect to the previous embodiment in FIGS. 8 to 11.

According to the present invention as described above, the rectifying apparatus is composed of rectifiers each having a capacitor for rectifying the A.C. output voltage from the A.C. generator into a direct current. Therefore, the rectifying apparatus of the present invention does not require the external connection of a capacitor having such a capacity as large as 2 uF as used in the conventional rectifying apparatus for a generator apparatus, making it possible to obtain noise reducing effect more than the conventional apparatus, to reduce the number of steps of assembling and working the apparatus, and to reduce the cost of the apparatus.

What is claimed is:

1. A rectifying apparatus for an automotive A.C. generator comprising:
   at least one rectifying device for converting an A.C. output of said generator into a direct current, each of said at least one rectifying device having a plurality of rectifiers, each of said plurality of rectifiers having a semiconductor chip and a capacitor connected in parallel therewith, thereby forming a parallel connection, and having a protecting sealer for insulating and sealing the parallel connection;
   wherein said semiconductor chip and capacitor of each of said plurality of rectifiers are connected in parallel with each other between an external connection terminal and a heat sink, thereby forming a parallel connection; and
   wherein said capacitor of each of said plurality of recitifiers is formed in a ring shape, and said heat sink is formed with a projection at a center on a bottom thereof, and wherein said semiconductor chip has one end connected to said projection of said heat sink, and said capacitor has one end connected to a periphery of said bottom of said heat sink, and wherein said semiconductor chip and said capacitor each have other ends which are connected to said external connection terminal, and said semiconductor chip and said capacitor are connected in parallel with each other, thereby forming a parallel connection.

2. A rectifying apparatus for an automotive A.C. generator comprising:
   at least one rectifying device for converting an A.C. output of said generator into a direct current, each of said at least one rectifying device having a plurality of rectifiers, each of said plurality of rectifiers having a semiconductor chip and a capacitor connected in parallel therewith, thereby forming a parallel connection, and having a protecting scaler for insulating and sealing the parallel connection;
   wherein said semiconductor chip and capacitor of each of said plurality of rectifiers are connected in parallel with each other between an external connection terminal and a heat sink, thereby forming a parallel connection; and
   wherein said capacitor of each of said plurality of rectifiers is formed in a box shape, and said heat sink is formed planarly, and said external connection terminal is formed with a bent part at a center thereof, and wherein said semiconductor chip is provided at said bent part of said terminal, and said capacitor is provided at a part of said external connection terminal other than said bent part, and said semiconductor chip and said capacitor have ends which are connected to said heat sink, and wherein said semiconductor chip and said capacitor are connected in parallel with each other, thereby forming a parallel connection.

* * * * *